United States Patent [19]

Pant

[11] Patent Number: 4,847,584

[45] Date of Patent: Jul. 11, 1989

[54] MAGNETORESISTIVE MAGNETIC SENSOR

[75] Inventor: Bharat B. Pant, St. Louis Park, Minn.

[73] Assignee: Honeywell Inc., Minneapolis, Minn.

[21] Appl. No.: 258,300

[22] Filed: Oct. 14, 1988

[51] Int. Cl.$^4$ ............................................. H01L 43/00
[52] U.S. Cl. ................................. 338/32 R; 324/252; 324/260
[58] Field of Search ........................ 338/32 R, 32 H; 324/252, 260, 244, 249

[56] References Cited

U.S. PATENT DOCUMENTS

| 3,949,346 | 4/1976 | Makino et al. | 338/32 R |
| 4,024,489 | 5/1977 | Bajorek et al. | 338/32 R |
| 4,079,360 | 3/1978 | Ohkubo et al. | 324/252 X |
| 4,296,377 | 10/1981 | Ohkubo | 324/252 |
| 4,503,394 | 3/1985 | Kawakami et al. | 338/32 R X |
| 4,517,515 | 5/1985 | Reinitz et al. | 338/32 R X |
| 4,533,872 | 8/1985 | Boord et al. | 324/252 |

OTHER PUBLICATIONS

"A New Approach to Offset Reduction in Sensors: The Sensitivity-Variation Method", Y. Xing, S. Kordic, S. Middlehoek, *J. Phys. E: Sci. Instrum.*, vol. 17, 1984, pp. 657–663.

"The Optimization and Design of Magnetoresistive Barber–Pole Sensors", S. Tumanski, M. Stabrowski, *Sensors and Actuators*, 7, (1985), pp. 285–295.

"Magnetic Field Sensors Using the Magnetoresistive Effect", U. Dibbern, *Sensors and Actuators*, 10, (1986), pp. 127–140.

*Primary Examiner*—E. A. Goldberg
*Assistant Examiner*—M. M. Lateef
*Attorney, Agent, or Firm*—W. T. Udseth

[57] ABSTRACT

A magnetic field sensor using a plurality of magnetoresistive material strips having conductors positioned over the strips near the ends but isolated therefrom, the strips being interconnected with interconnections located between the conductors. Strip ends may be tapered outside of the conductors. A plurality of such arrangements may be interconnected.

25 Claims, 3 Drawing Sheets

MAGNETORESISTIVE MAGNETIC SENSOR

BACKGROUND OF THE INVENTION

The present invention relates to magnetic field sensors based on magnetoresistive material and, more particularly, to such sensors requiring low usage of electrical power.

There are many situations in which there is a need to measure a magnetic field. Among such situations are the measurement of position or proximity of a magnetized portion of a structure, the readout of stored magnetic information, the measurement of current flows without the need of a measuring device in the current flow path, etc.

Many of the magnetic effects in such situations are relatively small and therefore require a sensitive magnetic sensor. A magnetic sensor capable of sensing such small magnetic field perturbations, and which is economical to fabricate, is provided on the basis of the magnetoresistive effect. Such magnetoresistive material based magnetic sensors can be fabricated using monolithic integrated circuit fabrication techniques, and so can not only be made economically but also made quite small in size. The magnetoresistive material is provided as a thin film when fabricated using monolithic integrated circuit techniques.

A magnetoresistive material based magnetic sensor is arranged by providing a magnetoresistive material to be used as an electrical resistor. A current is passed therethrough, and the voltage there across will depend on the effective resistance of the material over the path in which the current flows. That resistance value will depend in turn on the state of the magnetization of the material. If the magnetization is parallel to the current flow, the material will exhibit a maximum resistance, and it will exhibit a minimum resistance for magnetization perpendicular to the current flow.

In the magnetoresistive material there will be an effective magnetization, and this will be directed primarily along the easy axis of the material. An external field acting on the magnetoresistive material will rotate the magnetization direction therein to change the resistance of that material as a result. The changed resistance carrying the current causes a voltage drop change across the resistor which can be sensed as an indication of the magnitude of the external field.

The effective resistance of such a film will vary as the square of the cosine of the angle between the effective magnetization direction and the current flow direction through the material. The total resistance, however, is usually not of interest but rather the change in resistance in response to a change in the applied external magnetic field. This change is often best measured at a point along the squared cosine response curve where the curve approximates a linear function.

To provide operation on such a linear portion of the response curve requires that there be an initial angle between the direction of current flow and the nominal direction of magnetization in the absence of any externally applied fields. This can be accomplished in alternative ways in a bias arrangement. The magnetoresistive material can be placed on the device substrate as a continuous resistor in a "herringbone" pattern or set of continuously connected multiple inclines, with the angle of incline being approximately 45° with respect to the direction of extension of the resistor. There then must be provided a source for a magnetic bias field to be pointed in a direction which is 90° to the direction of the extension of the resistor.

Another method is to provide a linear strip of magnetoresistive material, but to add individual conductors across that strip at an angle of 45° with respect to the direction of the strip. This, in effect, causes the current to flow at an angle through the magnetoresistive strip with respect to the direction of elongation of the strip itself. This latter configuration is often called a "barber pole" sensor because of its configuration, and such an arrangement can eliminate the need for an external source of a magnetic bias field.

For low power usage, such a "barber pole" sensor is most effective if the magnetoresistive material strip is very long with respect to its width. This increases the resistance of the magnetoresistive material strip between its ends to thereby lower the power required to operate the device, and further, it substantially reduces demagnetization effects within the magnetoresistive material strip. However, there are limits to the length that such a strip can be continuously provided in a monolithic integrated circuit chip, and so the strip is often folded into a series of parallel portions. Each portion, as a series link, then folds back with respect to the preceding series link to thereby form a much more compact magnetoresistive material structure.

This leads to a relatively sharp curvature, however, at the locations where the magnetoresistive material in the folded strip completes one series link portion and then is bent around 180° to continue in a direction parallel to the preceding link to form another. These sharp turn regions lead to the formation of so-called magnetic end-domains in and near these bend regions. The magnetization direction in such domains can vary substantially with respect to the direction of magnetization in the parallel portions of the continuous strip. The magnetization of the parallel portions themselves will be well aligned with the direction of extension of each portion because of the length compared to the width thereof leading to reduced demagnetization effects therein.

A particular difficulty with such end-domains is that they are susceptible to change with temperature and external magnetic field excursions, and so does the magnetization direction therein. This has the effect of causing random fluctuations in the resistance of the strip and so in the voltage value occurring across the magnetoresistive material sensor for a given current therethrough. If four such magnetoresistive material sensors are used in a bridge circuit, these voltage variations due to thermal changes in the end-domains will lead to randomly changing values or fluctuations in the voltage of the bridge between the sense connections leading to errors in measurements based on a magnetometer using such a bridge. Thus, there is a desire to provide a magnetoresistive magnetic sensor having a more stable voltage occurring across the magnetoresistors therein despite temperature excursions.

SUMMARY OF THE INVENTION

The present invention provides a magnetoresistive device having a plurality of magnetoresistive material strips, there being a first conductor positioned over the strips near the first end of each but isolated from such strips, and a second conductor positioned over such strips near the second ends thereof but again being isolated from the strips. The strips are connected together to pass current therethrough. This connection can be made at the ends thereof for strips that are parallel to one another so that the strips are electrically connected in series. These ends may be tapered outside of the conductors. More than one of these arrangements can be connected together to form a sensing circuit including forming a bridge circuit.

DETAILED DESCRIPTION OF THE PREFERRED EMBODIMENTS

Figure 1:
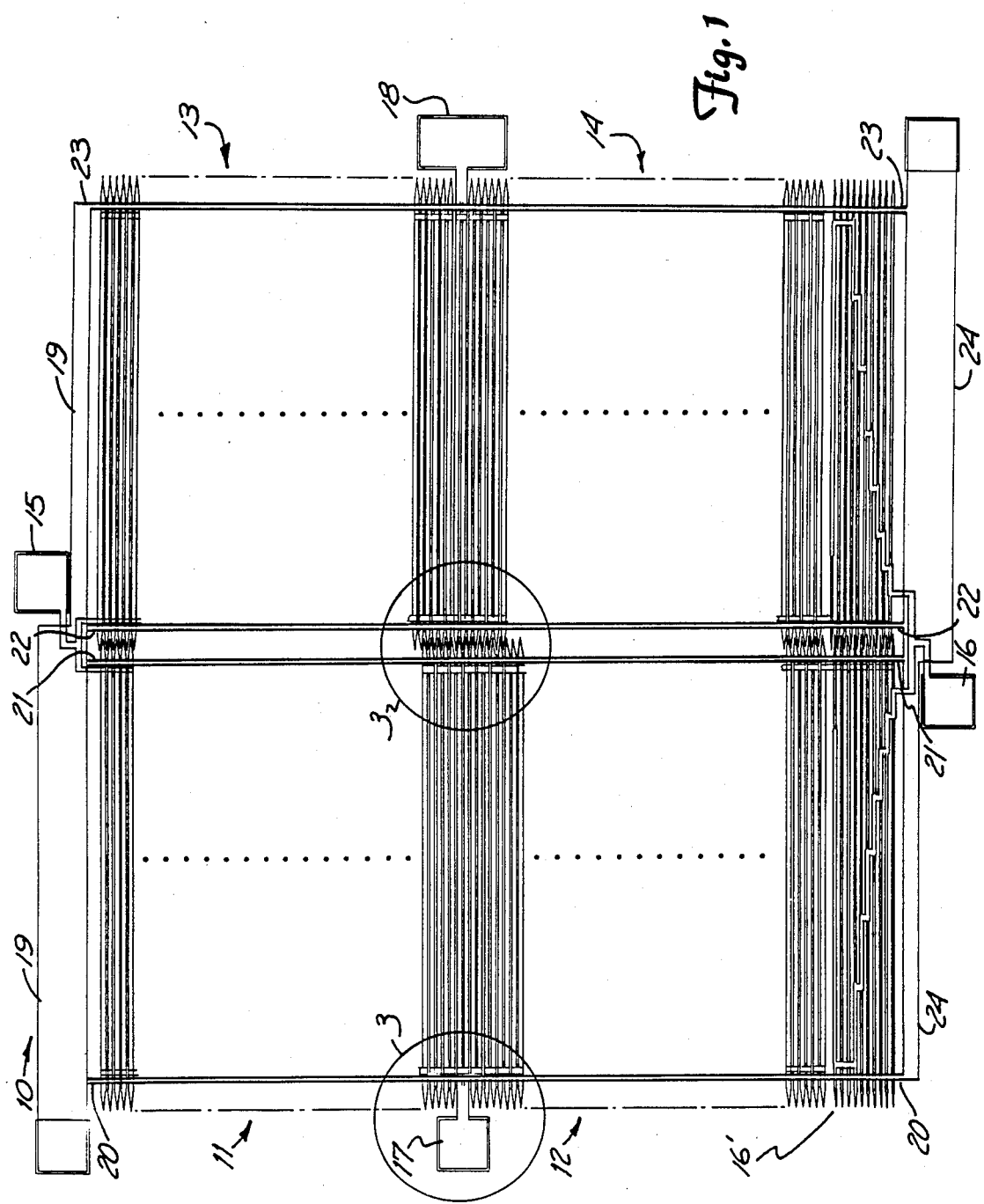
FIG. 1 shows in part a layout diagram of an embodiment of the present invention.

FIG. 1 shows a monolithic integrated circuit layout diagram for a "barber pole" magnetic field sensor, 10, based on four arrays, 11, 12, 13 and 14, of magnetoresistive material strips. Each of arrays 11, 12, 13 and 14 have a set of parallel positioned magnetoresistive strips electrically connected in series with one another which will be described in more detail below. The dots within each array indicate that only some of the strips are shown. Not all of the layers are shown, and some hidden lines are suppressed for clarity.

Arrays 11 and 13 are electrically connected together by an associated interconnection arrangement electrically connected also to a power supply terminal pad, 15. Arrays 12 and 14 are electrically connected together by another associated interconnection arrangement electrically connected also to a power supply terminal pad, 16. The interconnection arrangement associated with power supply terminal pad 16 involves a resistance value balancing arrangement, 16', formed of the same magnetoresistive material. Arrays 11 and 12 are electrically connected together through an associated interconnection arrangement electrically connected also to a sense signal output terminal pad, 17. Arrays 13 and 14 are electrically connected together by an associated interconnection arrangement electrically connected also to a sense output terminal pad, 18. Alternatively, terminal pads 17 and 18 could just as well be for a power supply with terminal pads 15 and 16 being sense signal outputs.

Sensor 10 of FIG. 1 has a further interconnection arrangement to provide supplementary magnetizing fields near the ends of the magnetoresistive material strips in each array. A first current supply terminal pad and current distribution arrangement, 19, distributes current with respect to four conductors to provide four current paths, 20, 21, 22 and 23, being electrically joined thereto. A further current supply terminal pad and current distribution arrangement, 24, is provided at the other end of these four conductors and is electrically joined thereto.

Figure 2:
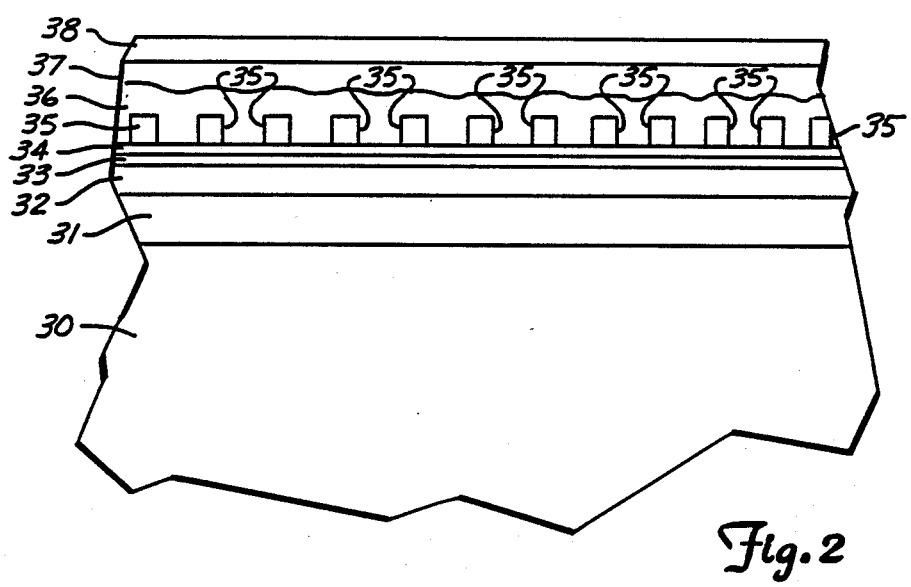
FIG. 2 shows a cross section view of a portion of the present invention.

FIG. 2 shows the general construction of the monolithic integrated circuit involved in the layout of FIG. 1, though not to scale and not necessarily in proportion for purposes of clarity. This monolithic integrated circuit is fabricated based on a semiconductor material substrate, 30, typically of silicon doped in the manner necessary to support other circuit portions of the monolithic integrated circuit. Substrate 30 has an insulating layer, 31, typically of oxides of silicon, primarily silicon dioxide. The thickness of layer 31 is typically 1.0μm. A further insulating layer, 32, is provided thereon and is typically a silicon nitride of a thickness of 0.5μm. Layer 32 provides a suitable surface on which to provide the magnetoresistive material.

The magnetoresistive material forming a thin layer, 33, on layer 32 is typically a ferromagnetic thin film having a thickness of 200 Å and formed of an alloy composed of nickel, cobalt and iron. As one example, the film material might comprise approximately 81% nickel and 9% of iron. In some situations, other materials are added to the alloy in relatively small amounts to improve selected properties of the film. The suggested composition will lead to there being relatively little magnetostriction occurring in the film, but there will be significant magnetoresistance and the film will exhibit uniaxial anisotropy.

The films may be annealed at an elevated temperature for several hours in the presence of a substantial magnetic field applied in a direction coincident with the axis of elongation of the magnetoresistive thin film strips to improve film stability. This occurs through increases in grain sizes and improving the coincidence of the material easy axis with the shape induced easy axis to reduce magnetic dispersion.

A film of tantalum nitride, 34, of a thickness of only 150 Å is provided over the magnetoresistive material. Such a film will be conductive vertically in FIG. 2, but will be highly resistive laterally because of its thinness and the material properties. Thus, the provision of a series of conductive straps, 35, to impart current directionality in magnetoresistive layer 33, at an angle of 45° to the direction of elongation of the magneoresistive material strips on the surface of layer 34 leaves these straps (i) in electrical contact with magnetoresistive material layer 33, but (ii) effectively electrically isolated from one another because of the properties of layer 34. Straps 35 have a thickness of approximately 0.5μm and are formed of aluminum alloyed with approximately 4% copper. The sideways extension of straps 35 due to their angular placement is omitted from FIG. 2 for clarity.

This set of aluminum straps is covered with, and the separations therebetween were filled, by a further insulating layer, 36, of typically silicon nitride extending approximately 1.0μm above the surface of tantalum nitride layer 34. Layer 36 protects the surface of the aluminum straps and provides an insulating barrier between them and the next layer above.

This next layer, 37, on nitride layer 36 is typically a further layer of aluminum alloyed with 4% copper, and is used to provide conductors 20, 21, 22 and 23. Layer 37 is provided typically in a thickness of 1.0μm. Layer 37 is covered with a further insulating and protecting layer, 38, again typically of silicon nitride to a thickness of 0.5μm. Interconnection terminal pads can be formed thereon, again with aluminum alloyed with 4% copper for interconnection purposes as desired. Such pads have not been shown in the structure of FIG. 2.

The formation of silicon wafer 30, in providing the variously doped regions therein necessary for other circuit portions, is done by methods well known in semiconductor device fabrication. Similarly, the provisions of the various layers, and straps 35, generally all the structures above silicon substrate 30, are also fabricated using well known monolithic integrated circuit fabrication techniques.

Arrays 11, 12, 13 and 14 of FIG. 1 each form a separate magnetoresistor comprising, as indicated above, many series-connected magnetoresistive strips. As such, and interconnected as described above by the interconnection arrangements associated with terminals 15, 16, 17 and 18, these resistors form a four element bridge circuit in FIG. 1. In operation, current can be supplied to terminal 15 and out at terminal 16, or vice versa. The signal voltage is taken differentially between terminals 17 and 18.

To balance the bridge output signal to as near zero as possible in the absence of an external magnetic field, resistive portions in balancing arrangement 16' are used. A substantial number of long resistors are provided in arrangement 16' which can be broken as necessary to equalize the resistance between the two alternative current paths between interconnection pads 15 and 16. The resistors in arrangement 16' are formed of the same magnetoresistive material as the strips aboved used for sensing, but with a narrower dimension.

The resistances in arrangement 16' primarily to the left of pad 16 are connected in parallel with each other, and this group is connected in series with arrays 11 and 12. The slanting interconnection line from upper left to lower right of these resistors excludes the portions thereof to the left to give several differing resistance values in parallel to permit accurate balancing. The resistances to the right of pad 16 in arrangement 16' are connected in parallel, and this parallel group is connected in series with arrays 13 and 14. The slanting interconnection arrangement is used here also. Breaking selected resistance tracks in either increases the resistance in that leg of the bridge circuit containing the arrays associated therewith.

Figure 3:
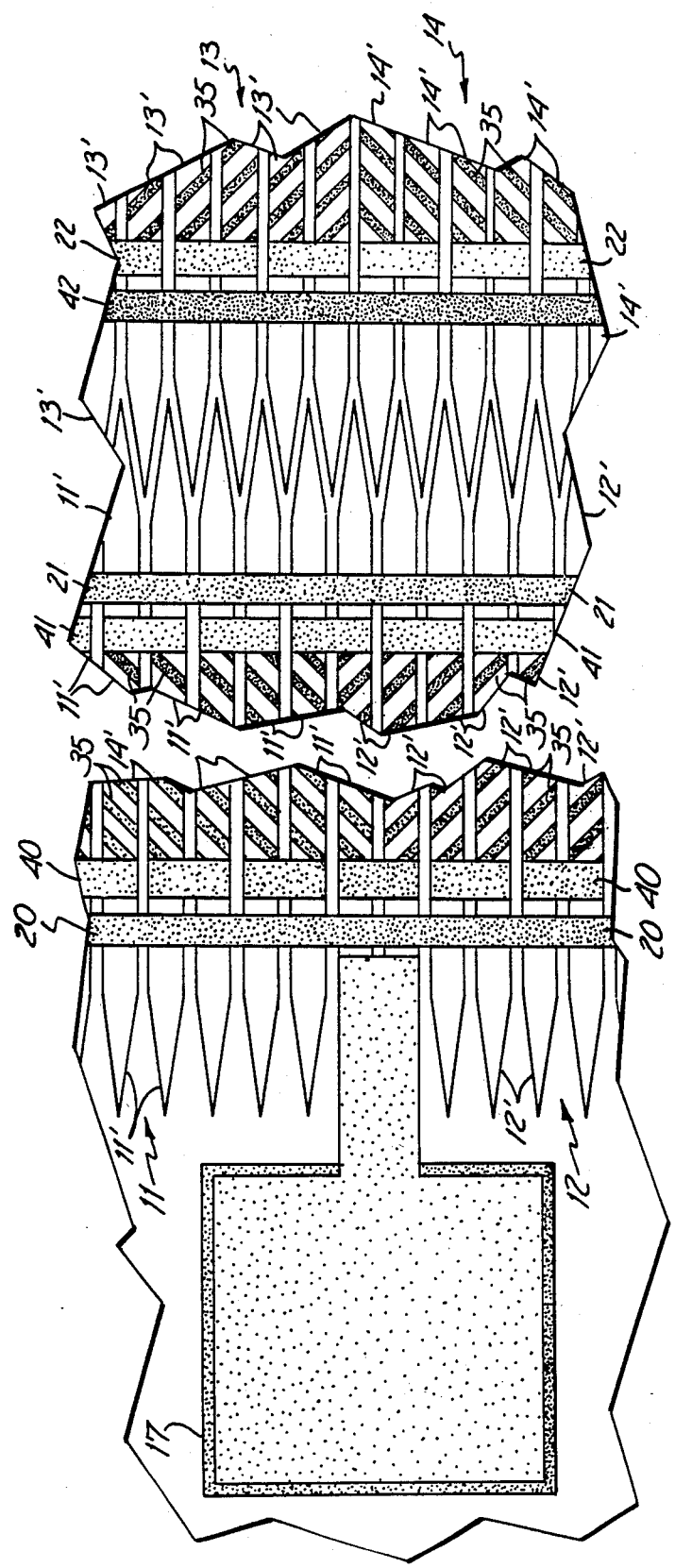
FIG. 3 shows fragment views from FIG. 1.

The magnetoresistive material strips of FIG. 1 are shown in more detail in FIG. 3, these fragment views being taken from the portions of the sensor with the circles marked 3 in FIG. 1. One of these sections involves the interconnection arrangement associated with sense signal terminal pad 17 and that terminal pad. This is shown in the fragment view on the left in FIG. 3 where it extends to and contacts two magnetic material strips, 11' and 12', one from array 11 and one from array 12, and each on either side of the space separating these two arrays from one another. That is, this is the point where these two arrays are joined in series with one another by the interconnection arrangement shown.

In addition to this interconnection, magnetoresistive material strips 11' of array 11 are each connected in series with one another as indicated above. This is also true for the magnetoresistive material strips in array 12, and in arrays 13 and 14. The interconnections on the left for magnetoresistive material strips 11' in array 11, and for strips 12' in array 12, are formed by the copper alloyed aluminum interconnections, 40. In the left-hand portion in FIG. 3, interconnections 40 are shown across the two magnetoresistive material strips 11' and 12' connected together by the interconnection arrangement associated with sense signal terminal pad 17, and then successive pairs of strips in each direction therefrom are connected together by an interconnection 40.

The right end portions of magnetoresistive material strips 11' and 12' are shown in part in the right-hand fragment view of FIG. 3 where further alloyed aluminum interconnections, 41, are provided joining pairs of strips. The two magnetoresistive material strips 11' and 12' connected together by the interconnection arrangement associated with sense signal terminal pad 17, as well as by interconnection 40, are left apart and not connected together in the right-hand view of FIG. 3. Rather, each is connected to the magnetoresistive material strip in its own array next adjacent thereto. Again, thereafter successive pairs of these magnetoresistive material strips in each array are connected together by interconnections 41. Thus, the magnetoresistive material strips in each array can be seen in the two fragmentary views of FIG. 3 to be connected in series with one another. Further interconnections, 42, are shown interconnecting the ends of magnetoresistive material strips 13' and 14' of arrays 13 and 14, respectively, in the right-hand fragment view of FIG. 3.

This interconnecting of all of the many magnetoresistive material strips in each array into a single resistor comprising a long series of interconnected strips as multiple links in the resistor is done, as indicated above, to provide a large resistance value for that resistor. This increase in resistance leads to much lower power drain when operating the sensor. The use of interconnections 40, 41 and 42 avoids having any bends in the magnetoresistive material which can lead to end-domains. However, terminated strips are subject to having so-called "buckling" magnetic domains form at the terminated ends thereof. Buckling domains are also a source of difficulty through having the magnetization therein again being susceptible to changing due to temperature and external magnetic field changes.

Conductive straps 35 are shown in FIG. 3 at 45° with respect to the direction of elongation, or the direction of extension, of the magnetoresistive material strips 11', 12', 13' and 14' shown there. Straps 35 have a positive slope for the magnetoresistive strips of arrays 11 and 14, and a negative slope for arrays 12 and 13. This results in an external magnetic field, applied to the sensor 10, tending to cause an increase in resistance in two of the arrays and a decrease in the resistance of the other two. As a result, the bridge will become unbalanced in resistance values in the two legs thereof between terminal pads 15 and 16, and, for a current therethrough, sense signal terminal pads 17 and 18 will exhibit a voltage difference representative of the strength of the external magnetic field, and, to some degree of the direction of that field.

The direction of the field will be sensed with respect to the axes of the sensor, one of which passes through signal terminal pads 17 and 18 and the other approximately perpendicular thereto. This directionality dependence occurs because the magnetization of the magnetoresistive material strips is primarily along the axis of elongation, or the extension, of those strips. An external field is most able to rotate that magnetization in those strips if it is perpendicular thereto, but is unable to rotate magnetization if it is parallel thereto.

Arrays for such a bridge circuit sensor arrangement have been provided in the past formed as a continuous magnetoresistive material strip. However, as indicated above, the resulting sharp bends lead to the formation of magnetic end-domains in the magnetoresistive material at the bends, domains having a magnetization which can shift with temperature excursions or the like so as to lead to a varying voltage difference between output signal terminal pads 17 and 18 in the absence of an externally applied magnetic field.

The use of interconnections 40, 41 and 42 in FIG. 3 to electrically interconnect adjacent magnetoresistive material strips into a single series resistor, as indicated above, helps to eliminate this source of output variation by electrically interconnecting adjacent magnetoresistive material strips with a nonmagnetic interconnection material to avoid having sharply curved magnetoresistive material. There is a gain using these interconnections through positioning these interconnections on the magnetoresistive material strips before reaching the ends of the strips. Thus, the interconnections are made before the portions in the magnetoresistive material strips are reached in which buckling domains tend to occur anyway, even without the bends in the magnetoresistive material which is near the ends thereof. This positioning of the interconnections 40, 41 and 42 assures that the current flow through the magnetoresistive material strips does not take place in the end portions subject to having buckling domains formed therein to thereby avoid voltage variations from this source.

At least this last result will be true if the buckling domains occurring at the ends of the magnetoresistive material strips are confined to remaining closer to the end portions of the strips than are the positions of the interconnections 40, 41 and 42 with respect to the magnetoresistive material strip ends to which they are adjacent. Two further measures are taken in sensor 10 to assure that such buckling domains stay toward the strip ends beyond the locations of the strip interconnection. The first of these measures is to taper the ends of the magnetoresistive material strips as shown in FIG. 3. Such tapering has been shown to reduce the formation of buckling domains compared to those formed in strips with squared-off ends. The tapering reduces the surface magnetic pole density and seems to provide some volume poles in the material itself. The tapering should occur over a distance which is typically one to four times the width or more of a magnetoresistive material strip which has a typical width of 20.0μm.

The other measure is the provision of conductors 20 and 21 on either side near the ends of magnetoresistive material strips 11' and 12' in arrays 11 and 12, respectively, and conductors 22 and 23 on either side near the ends of magnetoresistive material strips 13' and 14' of arrays 13 and 14, respectively. The current direction through these conductors is such as to create a magnetic field therebelow at the magnetoresistive material strips which has a direction substantially paralleling the direction of desired magnetization in those strips. Thus, this additional field tends to strengthen the existing magnetization in each of the magnetoresistive material strips and, in effect, prevent the occurrence of domains forming therein having a magnetization in the opposite direction to that desired. For this purpose, further conductors could be provided over other parts of the interior of these magnetoresistive material strips.

In addition, the magnetic fields resulting from current flow through these conductors tends to pin or lock the existing magnetization occurring in the center of the strip into continuing to extend thereunder. This provides, in effect, a barrier to buckling domains or other magnetic instabilities, present near the ends of these strips, from propagating inward toward the portions of the magnetoresistive material strips being used in providing the sensing for magnetic sensor 10.

Conductors 20, 21, 22 and 23 are typically 1.0μm in thickness, as indicated above, and have a width comparable or greater than the width of the magnetoresistive material strips. Strips of these dimensions can support a substantial current on the order of 10.0 mA or above to provide a magnetic field thereunder of three Oe or more without causing electrical migration of the material in the conductors themselves.

These measures lead to a substantially improved stability of performance of the magnetic sensor insofar as having a much more stable voltage appear between output sensor pads 17 and 18 over temperature excursions. This results in less variation in the output signal over substantial periods of time and between tests separated by substantial periods of time, and so leads to less uncertainty in the value of the externally applied field being measured.

Although the present invention has been described with reference to preferred embodiments, workers skilled in the art will recognize that changes may be made in form and detail without departing from the spirit and scope of the invention.

What is claimed is:

1. A magnetoresistive device for sensing magnetic fields, said magnetoresistive device having first and second power terminal regions, said device comprising:
   a first plurality of magnetoresistive material strips provided on a substrate each having a first end and a second end by which it is connected to pass electrical current if provided at said first power terminal region;
   a first conductor electrically connected to a first terminal means adapted for connection to a first source of current, said first conductor positioned over each of said first plurality of magnetoresistive material strips near said first end thereof but isolated therefrom; and
   a second conductor electrically connected to a second terminal means adapted for connection to a second source of current, said second conductor positioned over each of said first plurality of magnetoresistive material strips near said second end thereof but isolated therefrom.

2. The apparatus of claim 1 wherein each magnetoresistive material strip in said first plurality thereof has a portion near its said first end electrically connected to a portion of another near its said first end selectively excluding said first ends of up to two of such magnetoresistive material strips.

3. The apparatus of claim 1 wherein said first and second ends of each of said magnetoresistive material strips in said first plurality thereof taper toward a corresponding point.

4. The apparatus of claim 1 wherein said device further comprises a second plurality of magnetoresistive material strips provided on said substrate each having a first end and a second end by which it is connected to pass another electrical current if provided at said first power terminal region.

5. The apparatus of claim 1 wherein said device further comprises a second plurality of magnetoresistive material strips provided on said substrate each having a first end and a second end by which it is connected to pass said electrical current if provided at said first power terminal region together with said first plurality of magnetoresistive material strips.

6. The apparatus of claim 2 wherein each said magnetoresistive material strip on said first plurality thereof has a portion near its said second end electrically connected to a portion of another near its said second end selectively excluding said second ends of up to two of such magnetoresistive material strips.

7. The apparatus of claim 3 wherein said tapers on each end of said plurality of magnetoresistive strips begin outside that space occurring between outside edges of said first and second conductors.

8. The apparatus of claim 4 wherein a third conductor is positioned over each of said second plurality of magnetoresistive material strips near said first end thereof but isolated therefrom, and a fourth conductor is positioned over each of said second plurality of magnetoresistive material strips near said second end thereof but isolated therefrom.

9. The apparatus of claim 5 wherein said first conductor is positioned over each of said second plurality of magnetoresistive material strips near said first end thereof but isolated therefrom, and said second conductor is positioned over each of said plurality of magnetoresistive material strips near said second end thereof but isolated therefrom.

10. The apparatus of claim 6 wherein said magnetoresistive material strips in said first plurality thereof are positioned on said substrate parallel to one another with a said first end of one said magnetoresistive material strip, free of any said excluded ends, electrically connected to a said first end of an adjacent said magnetoresistive material strip with a said second end thereof electrically connected to a said second end of another said magnetoresistive material strip adjacent thereto.

11. The apparatus of claim 8 wherein said device further comprises a third plurality of magnetoresistive material strips provided on said substrate each having a first end and a second end by which it is connected to pass said electrical current passing through said first plurality of magnetoresistive material strips if provided at said first terminal region, and further, a fourth plurality of magnetoresistive material strips provided on said substrate each having a first end and a second end by which it is connected to pass that said other electrical current passing through said second plurality of magnetoresistive material strips if provided at said first terminal region.

12. The apparatus of claim 9 wherein a sensing terminal region occurs where current can pass from said first plurality of magnetoresistive material strips to said second plurality of magnetoresistive material strips.

13. The apparatus of claim 9 wherein each magnetoresistive material strip in said first plurality thereof has a portion near its said first end electrically connected to a portion of another near its said first end selectively excluding said first ends of up to two of such magnetoresistive material strips.

14. The apparatus of claim 9 wherein said first and second ends of each of said magnetoresistive material strips in said first plurality thereof taper toward a corresponding point.

15. The apparatus of claim 9 wherein current can pass from said second plurality of magnetoresistive material strips to said second power terminal region.

16. The apparatus of claim 10 wherein those said electrical connections between said first and second ends of said magnetoresistive material strips in said first plurality thereof are located between said first and second conductors.

17. The apparatus of claim 11 wherein said first conductor is positioned over each of said third plurality of magnetoresistive material strips near said first end thereof but isolated therefrom, said second conductor is positioned over each of said third plurality of magnetoresistive material strips near said second end thereof but isolated therefrom, said third conductor is positioned over each of said fourth plurality of magnetoresistive material strips near said first end thereof but isolated therefrom, and said fourth conductor is positioned over each of said fourth plurality of magnetoresistive material strips near said second end thereof but isolated therefrom.

18. The apparatus of claim 13 wherein each said magnetoresistive material strip on said first plurality thereof has a portion near its said second end electrically connected to a portion of another near its said second end selectively excluding said second ends of up to two of such magnetoresistive material strips.

19. The apparatus of claim 14 wherein said tapers on each end of said plurality of magnetoresistive strips begin outside that space occurring between outside edges of said first and second conductors.

20. The apparatus of claim 17 wherein a first sensing terminal region occurs where current can pass from said first plurality of magnetoresistive material strips to said second plurality of magnetoresistive material strips, and a second sensing terminal region occurs where current can pass from said second plurality of magnetoresistive material strips to said fourth plurality of magnetoresistive material strips.

21. The apparatus of claim 17 wherein each magnetoresistive material strip in said first plurality thereof has a portion near its said first end electrically connected to a portion of another near its said first end selectively excluding said first ends of up to two of such magnetoresistive material strips.

22. The apparatus of claim 17 wherein said first and second ends of each of said magnetoresistive material strips in said first plurality thereof taper toward a corresponding point.

23. The apparatus of claim 17 wherein currents can pass from said second and fourth pluralities of magnetoresistive material strips to said second power terminal region.

24. The apparatus of claim 21 wherein each said magnetoresistive material strip in said first plurality thereof has a portion near its said second end electrically connected to a portion of another near its said second end selectively excluding said second ends of up to two of such magnetoresistive material strips.

25. The apparatus of claim 22 wherein said tapers on each end of said plurality of magnetoresistive strips begin outside that space occurring between outside edges of said first and second conductors.

* * * * *